United States Patent [19]
Johnson

[11] Patent Number: 6,021,045
[45] Date of Patent: Feb. 1, 2000

[54] HEAT SINK ASSEMBLY WITH THREADED COLLAR AND MULTIPLE PRESSURE CAPABILITY

[75] Inventor: Philip Johnson, Kingston, N.H.

[73] Assignee: Chip Coolers, Inc., Warwick, R.I.

[21] Appl. No.: 09/179,044

[22] Filed: Oct. 26, 1998

[51] Int. Cl.[7] .................................................. H05K 7/20
[52] U.S. Cl. ........................ 361/704; 361/718; 361/719; 165/80.3; 165/185; 257/718; 257/719; 174/16.3
[58] Field of Search ................................. 361/690, 697, 361/702–704, 707, 717–719; 257/706, 707, 713, 717–719; 174/16.3; 165/80.2, 80.3, 185

[56] References Cited

U.S. PATENT DOCUMENTS

| | | | |
|---|---|---|---|
| Re. 35,573 | 7/1997 | Clemens | 257/719 |
| 2,916,159 | 12/1959 | O'Neill | 211/89 |
| 3,033,537 | 5/1962 | Brown, Jr. | 257/263 |
| 3,229,756 | 1/1966 | Keresztury | 165/67 |
| 4,345,267 | 8/1982 | Corman et al. | |
| 4,607,685 | 8/1986 | Mitchell, Jr. | 165/80.3 |
| 4,660,123 | 4/1987 | Hermann | 361/386 |
| 4,745,456 | 5/1988 | Clemens | |
| 5,313,099 | 5/1994 | Tata et al. | 257/717 |
| 5,397,919 | 3/1995 | Tata et al. | 257/717 |
| 5,566,052 | 10/1996 | Hughes | 361/704 |
| 5,579,827 | 12/1996 | Chung | 165/80.3 |
| 5,667,870 | 9/1997 | McCullough | 428/131 |
| 5,708,564 | 1/1998 | Lin | 361/704 |
| 5,774,335 | 6/1998 | Pare et al. | 361/704 |
| 5,825,622 | 10/1998 | Rife et al. | 361/704 |
| 5,917,703 | 6/1999 | Murphy | 361/704 |

FOREIGN PATENT DOCUMENTS

| | | |
|---|---|---|
| 0130279A3 | 1/1985 | European Pat. Off. |
| 29516627U1 | 12/1995 | Germany |
| 58-176959 | 10/1983 | Japan |

Primary Examiner—Donald Sparks
Assistant Examiner—Boris L. Chervinsky
Attorney, Agent, or Firm—Barlow, Josephs & Holmes, Ltd

[57] ABSTRACT

A heat dissipating device which can provide multiple levels of pressure to a semiconductor package, having an outer peripheral ceramic region and an inner silicon region and installed in a socket, is provided. A clip member is provided with a central female-threaded bore. A collar, having outer male threads and inner female threads is threadably receivable within the bore of the clip member. The collar is threaded down into the bore to communicate with an upper surface of the ceramic portion of a semiconductor device at a first pressure which is high enough to maintain the package in electrical communication with its socket. A heat dissipating member, having a male-threaded base, is threadably installed into the female-threaded bore of the collar to engage the upper surface of the silicon portion of the semiconductor package. The pressure of the heat dissipating member onto the silicon portion of the package is independently adjustable relative to the pressure of the collar onto the ceramic portion of the semiconductor package. As a result, the multiple pressure requirements of the semiconductor package can be accommodated in a single heat dissipating device.

14 Claims, 11 Drawing Sheets

HEAT SINK ASSEMBLY WITH THREADED COLLAR AND MULTIPLE PRESSURE CAPABILITY

BACKGROUND OF THE INVENTION

The present invention relates generally to electronic solid state and integrated circuit devices. More specifically, the present invention relates to apparatuses for dissipating heat generated by such devices.

In the electronics and computer industries, it has been well known to employ various types of electronic device packages and integrated circuit chips, such as the PENTIUM central processing unit chip (CPU) manufactured by Intel Corporation and RAM (random access memory) chips. These integrated circuit chips have a pin grid array (PGA) package and are typically installed into a socket which is soldered to a computer circuit board. These integrated circuit devices, particularly the CPU microprocessor chips, generate a great deal of heat during operation which must be removed to prevent adverse effects on operation of the system into which the device is installed. For example, a PENTIUM microprocessor, containing millions of transistors, is highly susceptible to overheating which could destroy the microprocessor device itself or other components proximal to the microprocessor.

In addition to the PENTIUM microprocessor discussed above, there are many other types of semiconductor device packages which are commonly used in computer equipment, for example. Recently, various types of surface mount packages, such as BGA (ball grid array) and LGA (land grid array) type semiconductor packages have become increasingly popular as the semiconductor package of choice for computers. For example, many microprocessors manufactured by the Motorola Corporation, for use in Apple Corporation computers, employ BGA-type packages. Unlike a PENTIUM microprocessor with a PGA package, which has pins to be installed into a receiving socket, BGA and LGA semiconductor packages include an array of electrical contacts on their bottom surfaces to engage directly with an array of receiving electrical contacts on a circuit board, socket or the like. These semiconductor device packages have, in the past, been soldered directly to a circuit board or socket. However, such direct soldering makes replacement and/or upgrade of the semiconductor device package more difficult because it must be unsoldered from the board or socket for such replacement or upgrade.

To address the foregoing concerns, various sockets are being provided to receive, in temporary fashion, a BGA, LGA or similar surface mount semiconductor device package. In the event replacement or upgrade is required, the semiconductor package is simply removed from the socket and replaced with the new package. However, there are various concerns relating to the use of such BGA and LGA socket. For example, since no soldering is carried out in these new socket configurations, the solder balls of a BGA package and the contacts of an LGA must be maintained in electrical communication with the corresponding contact array on the socket. As a result, a minimum amount of pressure or force must be maintained on the semiconductor device package to maintain the electrical contact with the socket. It is not uncommon for the required minimum pressure to be in the vicinity of 50 psi (pounds per square inch) to maintain the electrical connection of the device package to the socket into which it is installed. If this pressure is not maintained, or is not consistent over the surface of the package, the electrical connection will fail.

Various efforts have been made to simply clamp the semiconductor device package, such as a BGA or LGA, to its corresponding socket by a top planar member with a series of screw fastening members sufficiently secured to attain the desired psi pressure on the package. However, BGA and LGA and similar packages commonly include a separate silicon portion containing the actual electronic components which is then subsequently mounted in some fashion to a larger ceramic base. Problems have arisen in connection with these BGA and LGA socket systems because at least 40 or 50 psi must be applied to the ceramic portion to maintain the socket interconnection; however, while the silicon pad region would be crushed and/or damaged by such a force applied thereto. It is not uncommon for such a device package to have a minimum 50 psi requirement on the ceramic portion to maintain the electrical interconnection to the socket while having a maximum 10 psi requirement on the silicon portion to avoid damage thereto.

In similar fashion to the PENTIUM-type semiconductor devices discussed above, the BGA, LGA and related device packages also suffer from excessive generation of heat. If such heat is not properly dissipated, the chip will eventually fail. As a result, efforts have been made to supply a heat dissipating member, such as a heat sink, into thermal communication with the silicon portion of the semiconductor device package, such as a BGA or LGA chip. As a result of the competing needs for heat dissipation and pressure to maintain the socket connection, problems arise. In particular, simple clamping of a heat sink member to the top portion of a BGA socket must be maintained at a pressure sufficient to maintain the electrical interconnections to the socket; however, such a high pressure creates a risk of damage to the silicon portion of the package.

The foregoing problems are exacerbated due to the different configurations of semiconductor packages which may be installed on a circuit board. For example, a BGA or LGA package may include a ceramic base with a sensitive silicon portion mounted directly on a central region thereon whereby the central portion of the resultant package of both silicon and ceramic is thicker than the outer ceramic only peripheral portion. Further, a semiconductor package may include a silicon portion which is embedded within the ceramic resulting in a flush top surface. Also, the ceramic portion of the package may have a recess in its upper surface for receiving the silicon member which results in the silicon member being recessed lower than the upper surface of the ceramic portion of the package. Still further, the silicon portion or portions of a semiconductor package may be carried about the periphery of the package in accordance with certain applications. In general, the aforementioned wide range of possible semiconductor package designs make the effective heat dissipation therefrom without damage to the package extremely difficult and cumbersome.

In view of the foregoing, there is a demand for a heat sink assembly which can simultaneously provide the requisite high pressure for maintaining a semiconductor device package in electrical interconnection with its corresponding socket while simultaneously providing a heat sink member in flush thermal communication with the silicon portion of a package at a second pressure much lower than the pressure being simultaneously applied to the ceramic portion of the semiconductor device package. In addition, there is a demand for a heat sink assembly that can independently adjust the pressure applied to the ceramic portion of a package while permitting custom adjustment of the pressure of a heat sink applied to the silicon portion of the same semiconductor device package.

SUMMARY OF THE INVENTION

The present invention preserves the advantages of prior art heat sink assemblies for integrated circuit devices, such as microprocessors. In addition, it provides new advantages not found in currently available assemblies and overcomes many disadvantages of such currently available assemblies.

The invention is generally directed to the novel and unique heat sink assembly with particular application in cooling microprocessor integrated circuit devices, such as a ball grid array (BGA) and land grid array (LGA) semiconductor device packages. The heat sink assembly of the present invention enables the simple, easy and inexpensive assembly, use and maintenance of a heat sink assembly while realizing superior heat dissipation.

The heat dissipating device of the present invention includes a semiconductor socket and a semiconductor package installed therein. The semiconductor package has a lower surface with electrical contacts thereon and electrical contacts are in electrical communication with seats on the semiconductor socket. The semiconductor package includes an outer peripheral region of the semiconductor package and a first upper surface and an inner pad region of the semiconductor package and a second upper surface.

A retaining clip is provided which has a central member and a pair of legs depending downwardly from respective opposing ends of the central member with ends of said pair of legs not connected to the central member being free ends. An aperture is disposed through the central member defining a central member bore having female threading formed therein. The free ends of the pair of legs are secured relative to the semiconductor socket with the central member bore being positioned substantially above the semiconductor package.

Further, a collar is provided which has an outer edge defining male threading thereon with a collar bore therethrough having female threading thereon. The collar is threadably installable into the central member of the retaining clip with the male threading of the collar being threadably engageable with the female threading in the central member bore. The collar is threadably rotatable within the central member bore and positionable into communication with the first upper surface of the semiconductor package at a desired outer peripheral pressure.

A heat dissipating member, having a threaded base portion with a substantially flat bottom surface, is adapted to be threadably received in the female threaded collar bore so that the flat bottom surface of the heat dissipating member is in flush thermal communication with the second upper surface of the semiconductor package at the inner pad region. The heat dissipating member, and threaded routing into the threaded bore, defines an inner pad region pressure onto the second surface of the semiconductor package.

As a result, the outer peripheral region pressure and the inner pad region pressure are independently adjustable from one another to enable different pressures to be applied to the first upper surface of the semiconductor package and the second upper surface of said semiconductor package, respectively.

In operation, the semiconductor package is installed into its receiving semiconductor socket, which is commonly installed onto a circuit board, or the like. The clip member is then connected to the socket and disposed over the semiconductor package by use of its downwardly turned legs, for example, to secure the clip member relative to the socket. The collar is threadably installed into the bore of the clip so that the collar exerts a desired pressure onto the ceramic portion of the semiconductor package. Subsequently, the heat dissipating member is threadably installed into the bore of the collar into pressure and thermal flush communication with the top of the silicon portion of the semiconductor package. The heat dissipating member can be threadably rotated to fine adjust the pressure applied to the silicon portion of the semiconductor package which is typically different than the pressure applied by the collar to the ceramic portion of the semiconductor package. As can be understood, the application to the outer peripheral ceramic of the packet can be applied separately and independently from the pressure applied to the central pad silicon portion of the package.

It is therefore an object of the present to provide a heat sink assembly which can accommodate a wide array of semiconductor device packages.

Another object of the present invention is to provide a heat sink assembly with multiple pressure capability.

It is a further object of the present invention to provide a heat sink assembly which can provide a given pressure to a first portion of a semiconductor device package while simultaneously applying a different pressure to a second portion of a semiconductor device package.

It is a further object of the present invention to provide a heat sink assembly which can provide independently adjustable pressure to the ceramic portion of a semiconductor device package and flush thermal communication at a second pressure to the silicon portion of the package.

BRIEF DESCRIPTION OF THE DRAWINGS

The novel features which are characteristic of the present invention are set forth in the appended claims. However, the inventions preferred embodiments, together with further objects and attendant advantages, will be best understood by reference to the following detailed description taken in connection with the accompanying drawings in which:

DETAILED DESCRIPTION OF THE PREFERRED EMBODIMENT

Figure 1:
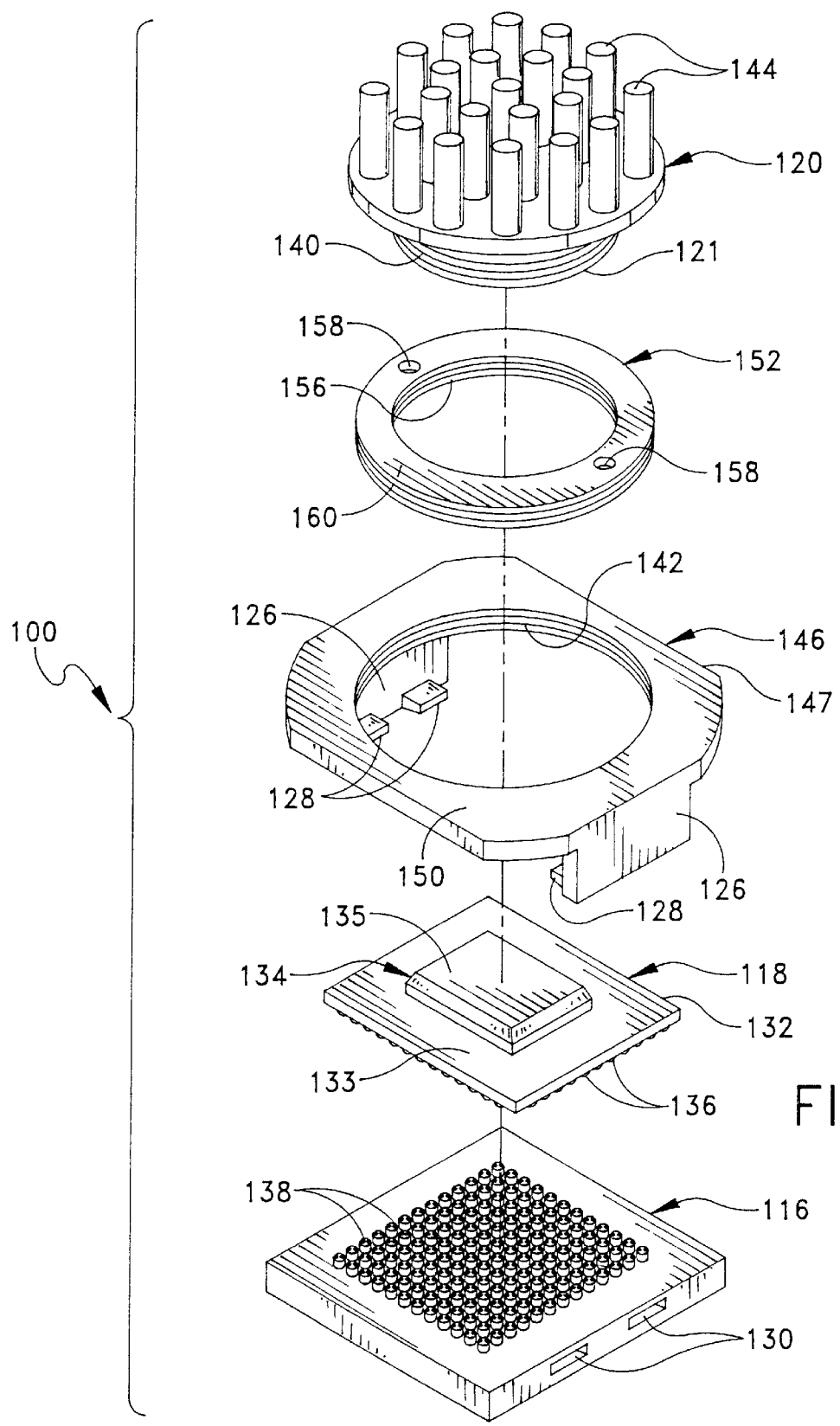
FIG. 1 is an exploded perspective view of the preferred embodiment of the heat sink assembly of the present invention.
Figure 6:
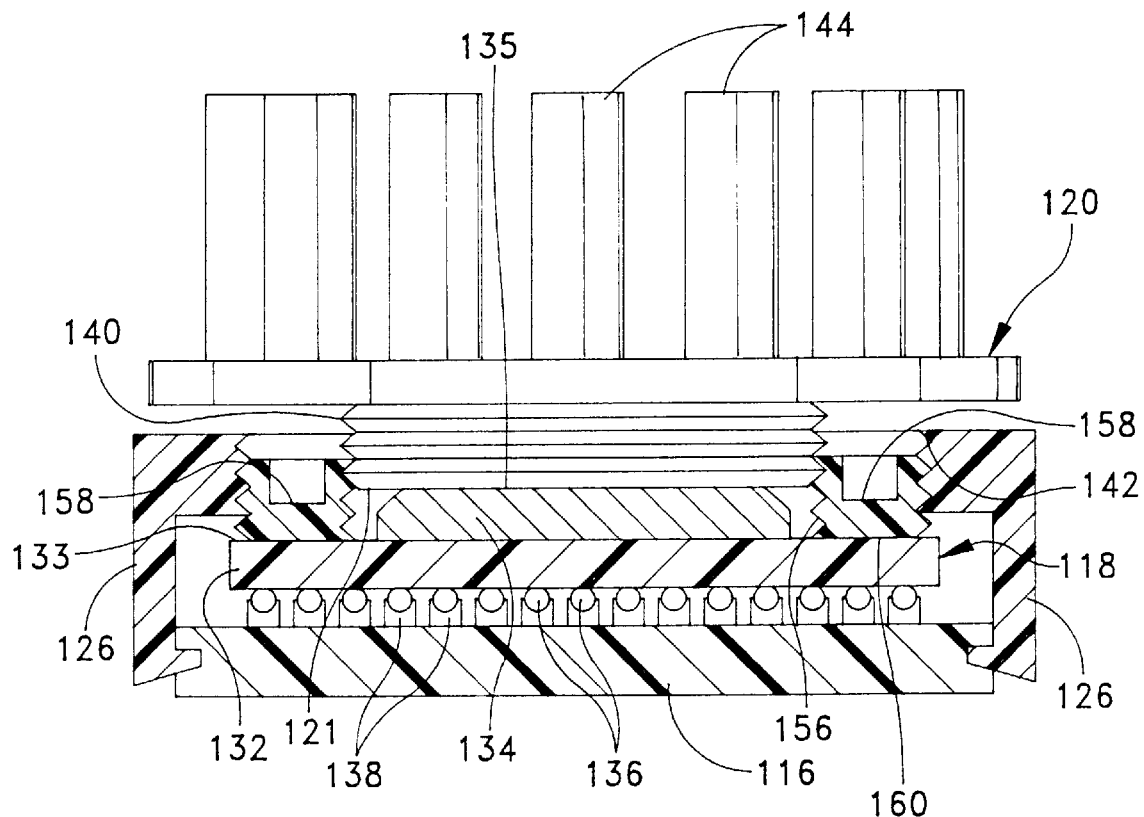
FIG. 6 is the partial cross-sectional view of FIG. 5 with heat sink assembly installed.
Figure 7:
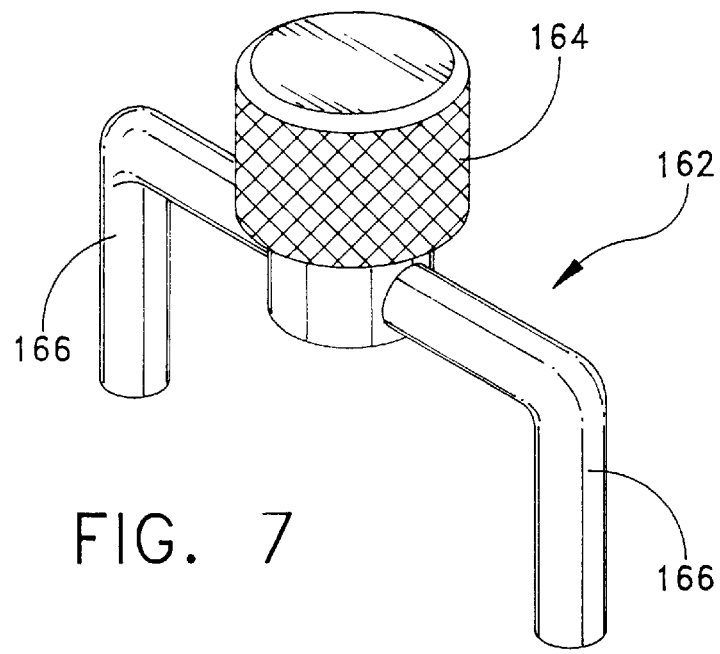
FIG. 7 is a perspective view of a tool for facilitating the rotation of the threaded collar member.
Figure 8:
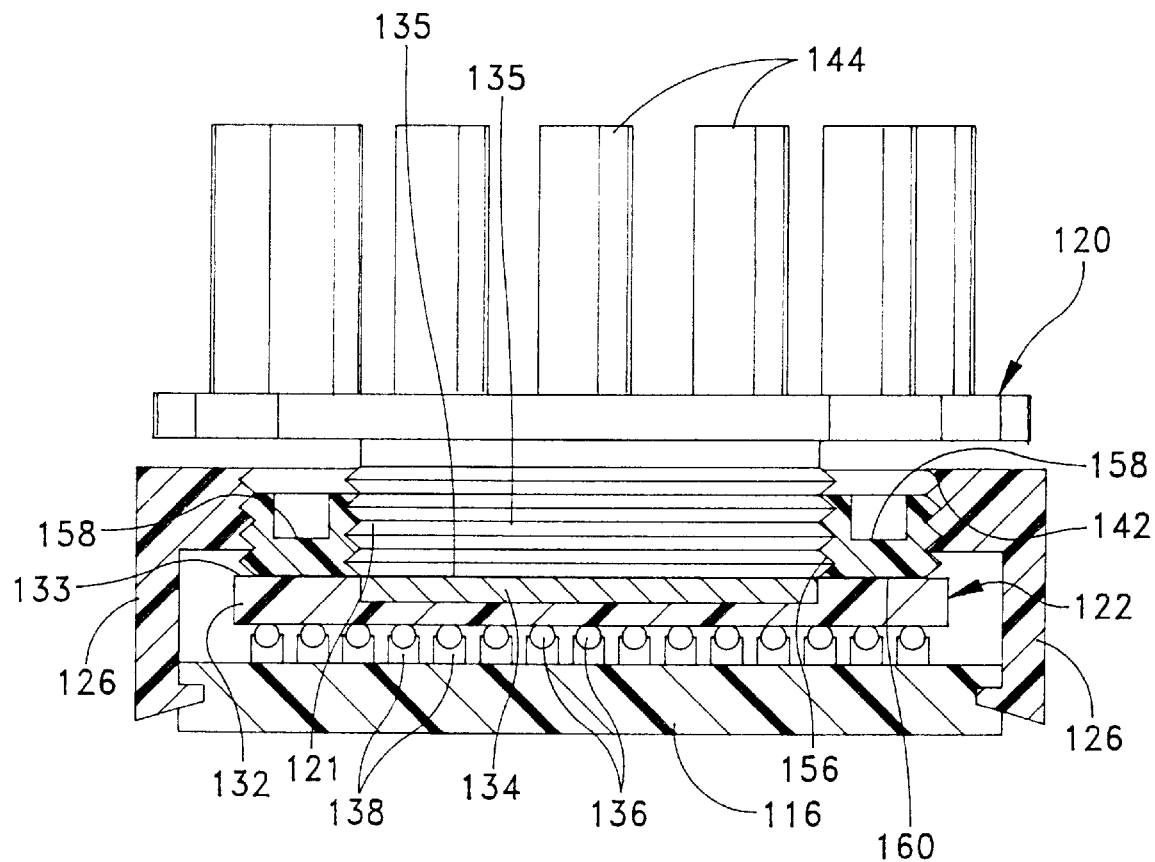
FIG. 8 is a cross-sectional view of the heat sink assembly of FIG. 1 accommodating a semiconductor package with a silicon portion having an upper surface which is flush with the upper surface of the ceramic portion of the package.

Referring first to FIG. 1, the heat sink assembly 100 of the present invention is shown. It should be noted that the present invention provides a heat sink assembly 100 for a BGA-type semiconductor device package 118. It should be understood that various other types of semiconductor packages may be employed within and accommodated by the present invention. As stated above, various semiconductor packages are available such BGA and LGA designs. These packages may include a silicon portion mounted on a ceramic portion, a silicon portion embedded in and flush with a ceramic portion, the silicon portion flush with the ceramic portion, or the like. The present invention can accommodate all of the aforementioned package designs. Further, various types of socket and contact arrays may be employed and still be within the scope of the present invention. For ease of illustration, the following description relates to employment of the present invention for a BGA semiconductor device package 118. However, other types of packages, such as LGA packages, may also be easily accommodated by the heat sink assembly 100 of the present invention. In particular, FIGS. 1–7 illustrate employment of the present invention to accommodate a common BGA semiconductor device package where the silicon portion is mounted on a ceramic portion. FIGS. 7 and 8, as will be described in detail below, illustrate the flexibility of the present invention to accommodate a wide range of type of semiconductor device packages.

Referring to FIG. 1, the preferred embodiment of the present invention is shown. A semiconductor socket 116, commonly installed on or hard-wired to a circuit board (not shown) includes an array of contacts 138 which serve as BGA ball seats for engagement with BGA balls 136 on the underside of BGA semiconductor device package 118. As a result, contact array 138, via socket 116, serves as an interconnection for BGA semiconductor device 118 and the non-soldered engagement of balls 136 thereto to maintain electrical interconnection between BGA device 118 and socket 116.

In particular, BGA device 118 includes a ceramic portion 132 containing internal interconnections (not shown) from silicon portion 134 to BGA contact balls 136. BGA device 118 provides a top surface 133 of ceramic 132 as well as a second top surface 135 of silicon portion 134. BGA device package 118 is installed onto its socket 116 so that solder balls 136 communicate with corresponding seats 138.

Still referring to FIG. 1, the heat sink assembly 100 of the present invention includes clip 146 with a central top member 147 having a threaded aperture or bore 142 therethrough. Legs 126 downwardly extend or depend from top member 146. The free ends of legs 126 include inwardly turned flanges 128 for securing clip 146 relative to socket 116. In particular, protrusions or lips 128 engage with aperture 130 in the side walls of socket 116. As a result, clip 146 is secured relative to socket 116 and can adequately provide a framework for the heat sink assembly 100 of the present invention.

It should be noted that the downwardly depending legs 126 in communication of flanges 128 and apertures 130 are a preferred configuration for securing clip 146 relative to socket 116. However, it should be understood that many other structures may be employed for this purpose. For example, downwardly depending legs 126 may include small windows or apertures (not shown) to engage with protrusions (not shown) emanating outwardly from the sides of socket 116 which is commonly found in ZIF socket configurations. Alternatively, downwardly depending legs 126 may be simply bolted directly to socket 116 or to the circuit board itself (not shown) onto which socket 116 is installed. In general, and in accordance with the present invention, clip 146, namely top member 148 is secured and fixed relative to socket 116. The particular connection methods discussed above and other configurations employed depend on the particular application and installation environment at hand. For ease of discussion, the present invention will be discussed below as to the employment of downwardly depending legs 126 and inwardly turned flanges 128 which engage with apertures 130 into the side panels of socket 116.

Figure 2:
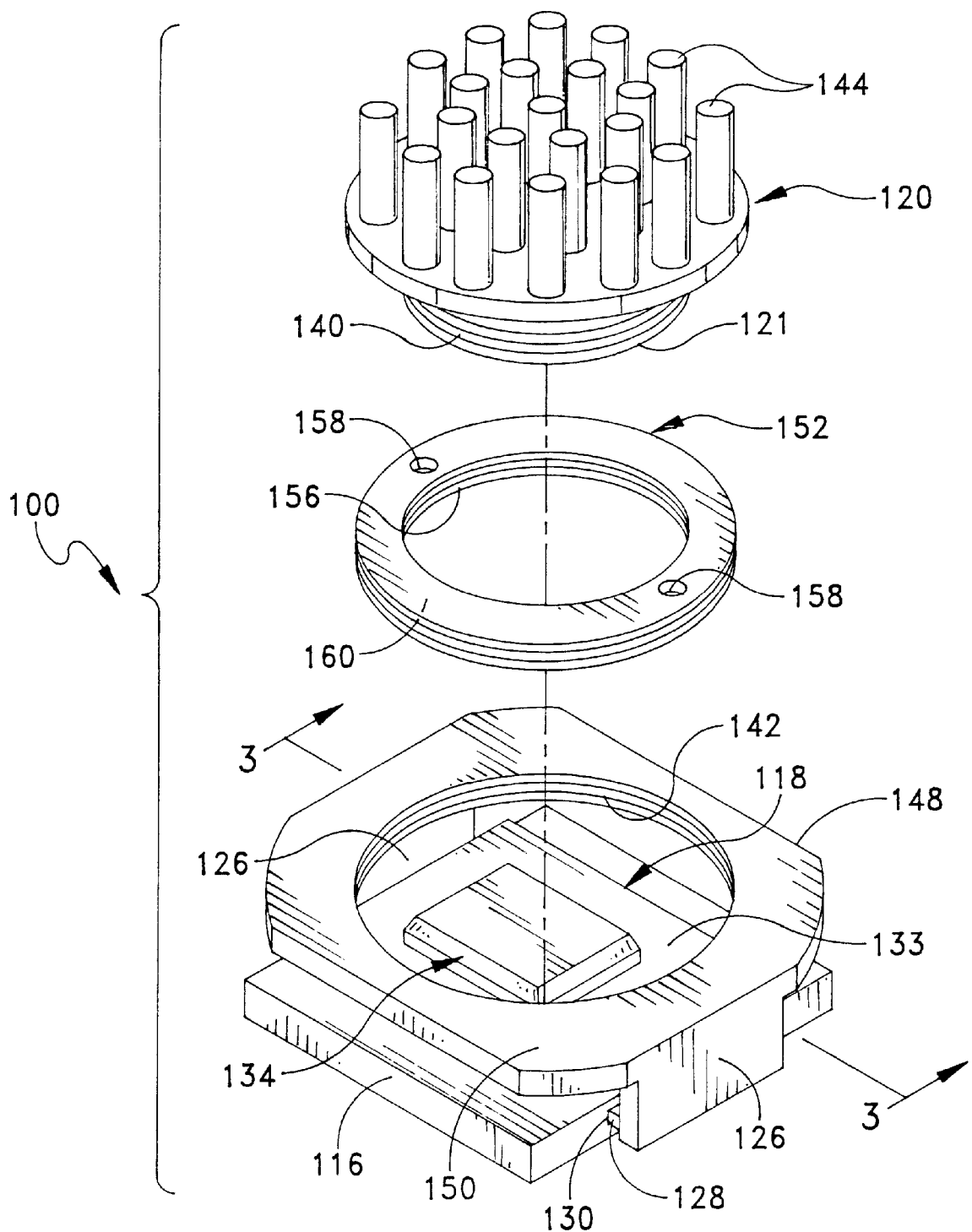
FIG. 2 is a partially assembled perspective view of the heat sink assembly of the present invention of FIG. 1.
Figure 3:
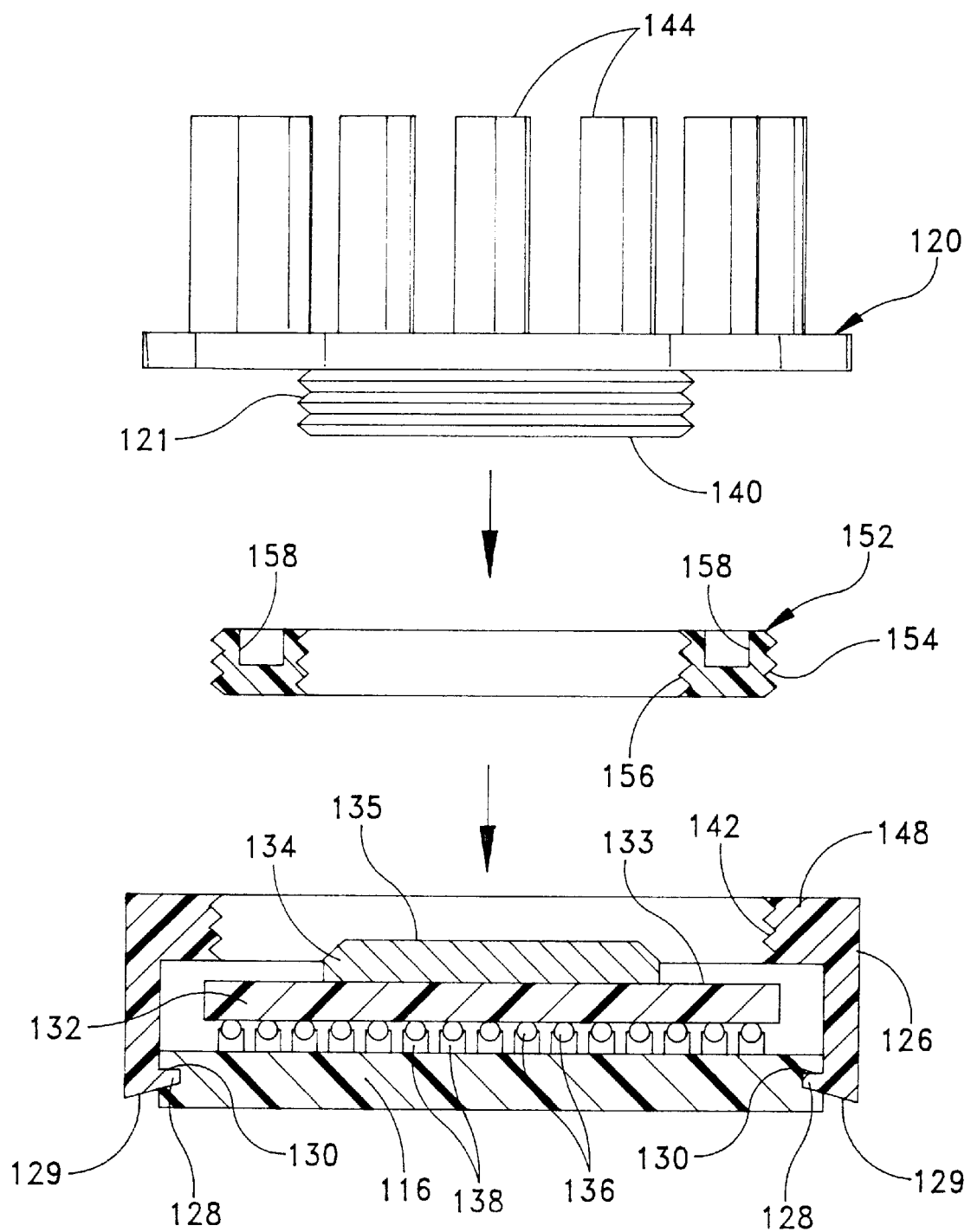
FIG. 3 is a partial cross-sectional view through the line 3—3 of FIG. 2.

Referring now to FIGS. 1–3, semiconductor package 118 is positioned on socket 116 as described above. Clip 146 is positioned over socket 116 with semiconductor device package 118 disposed therebetween. Flanges 128 of legs 126 reside within apertures 130 and socket 116. Such connection can be made by snapping clip 146 over socket 116 via an outwardly camming action of angled surfaces 129 of legs 126 so that flanges 128 can clear into apertures 130.

Figure 4:
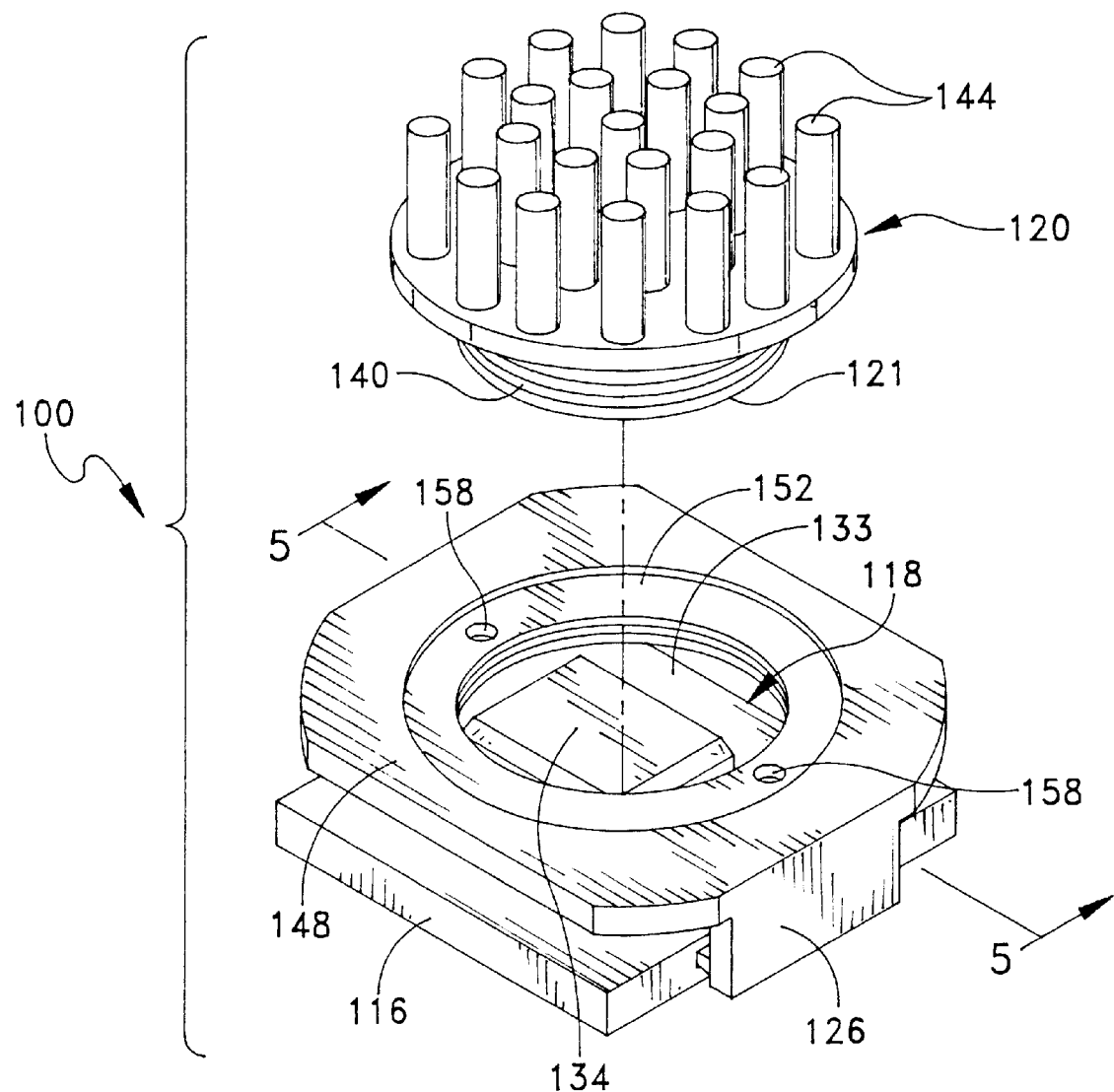
FIG. 4 is a partially assembled perspective view of the heat sink assembly of the present invention of FIG. 1 with threaded collar in the process of being installed.

Once clip 146 is secured in place relative to socket 116, collar 152, with outer male threads 154 and inner female threaded bore 156 is threadably installed into female threaded aperture 142 of clip 146. Threaded installation of collar 152 into clip 146 is facilitated by the employment of a pair of detents 158 which receive the prongs 166 of tool 162 shown in FIG. 7. Such rotation of collar 152 can be facilitated by rotation of handle 164 of tool 162 to impart the desired rotational forces on collar 152 via prongs 166. Other structures may be employed to facilitate the rotation of collar 152, such as upstanding protrusions from collar 152 which may be hand-manipulated by the user. FIG. 4 illustrates, without showing tool 162, the threaded installation of collar 152 into top member 148 of clip 146.

Figure 5:
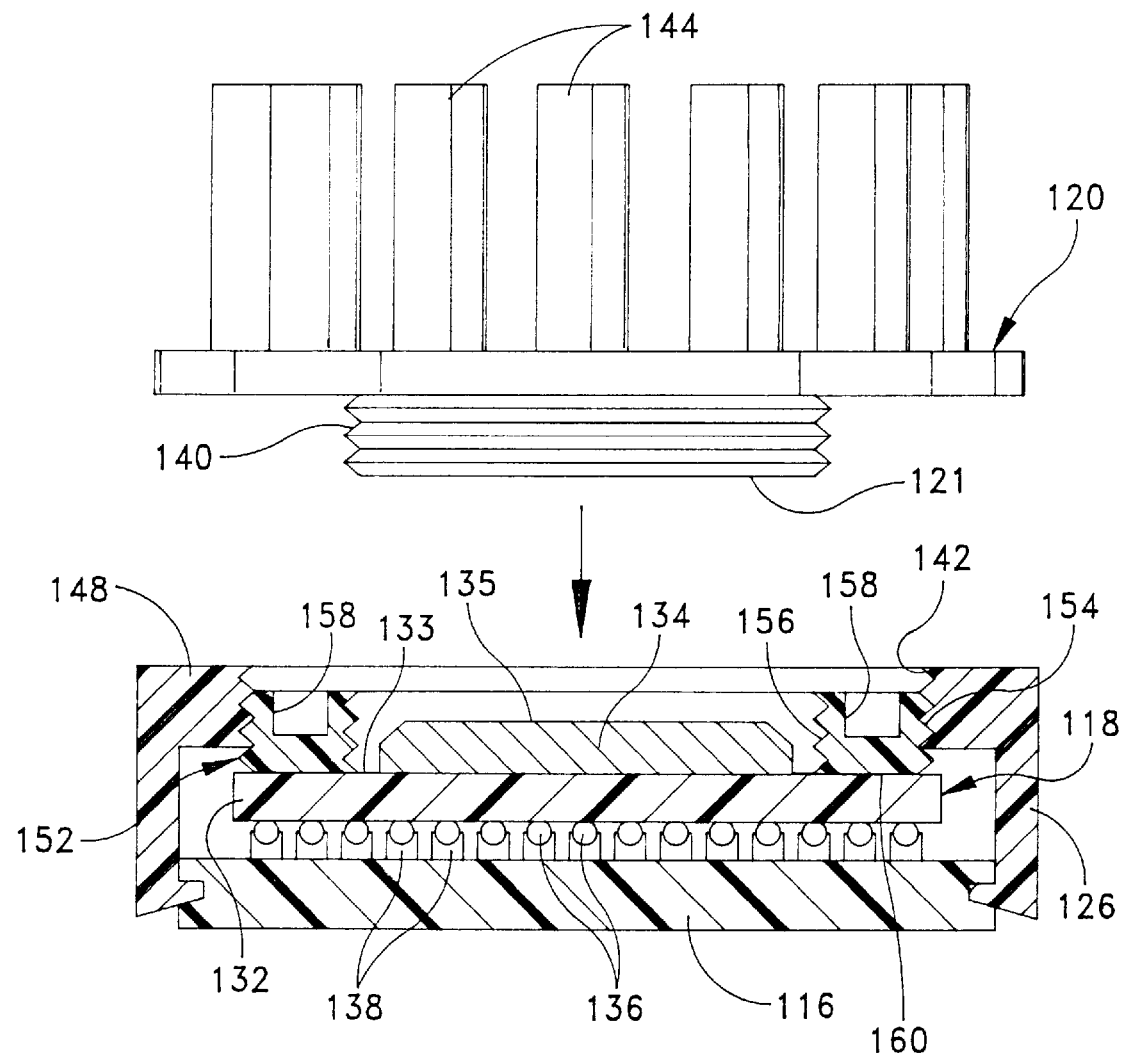
FIG. 5 is a partial cross-sectional view through the line 5—5 with threaded collar fully installed.

Turning now to FIG. 5, the complete installation of collar 152 is shown. In particular, collar 152 has been threaded into top member 148 of clip 146 by threaded engagement of outer threads 154 of collar 152 into engagement with female threaded aperture 142. Rotation of collar 152 causes the bottom surface 160 of collar 152 to communicate with top surface 133 of ceramic portion 132 of semiconductor package 118. The threaded rotation of collar 152 within clip 146 contacts only the ceramic portion 132 of semiconductor package 118 while permitting silicon portion 134 to reside within collar 152, namely within inner threads 156. Such downward threaded engagement of collar 152 maintains an adjustable downward pressure on ceramic portion 132 of semiconductor package 118 so as to maintain consistent electrical contact between contacts 136 and corresponding seats 138. A common desired pressure, in order to maintain such electrical connection, is typically in the range of 50 psi.

After collar 152 is installed to ensure electrical contact of the semiconductor package 118 to its socket 116, heat sink assembly 120 can now be installed. Referring to FIG. 6, threaded shank 140 is installed into inner threads 156 of collar 152 so that the bottom surface 121 of heat dissipating member 120 is placed into pressure and flush thermal communication with the top surface 135 of silicon portion 134 of semiconductor package 118. Heat dissipating member 120 is threadably engageable with inner threads 156 of collar 152 independently of the engagement of collar 152 with female threaded aperture 142.

Heat dissipating member 120 is threadably installed to a desired tension and pressure. As discussed above, this pressure is preferably less than the pressure applied by collar 152 to the ceramic portion 132 because silicon portion 134 is much less tolerant to pressure and more easily damaged. In that connection, the pressure applied to the silicon portion 134 can be easily adjusted by threadably rotating heat dissipating member 120 to the desired tension. As a result, pressure to the ceramic portion 132 of package 118 can be independently set from the pressure applied to the silicon portion 134 of package 118.

Figure 9:
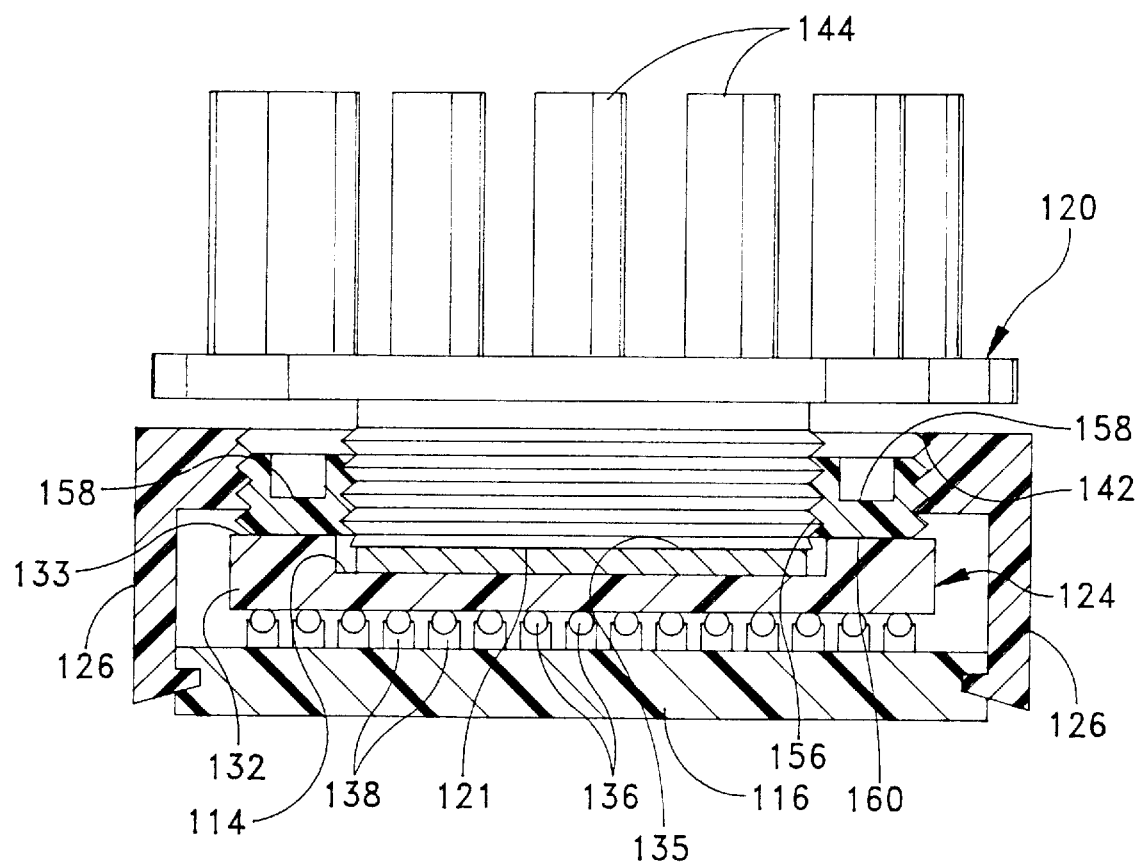
FIG. 9 is a cross-sectional view of the heat sink assembly of FIG. 1 accommodating a semiconductor package with a silicon portion having an upper surface which is recessed relative to the upper surface of the ceramic portion of the package.

Turning now to FIGS. 8 and 9, the flexibility of the present invention to accommodate different types of semiconductor packages is shown. As seen in FIG. 8, the heat sink assembly 100 of the present invention is shown to accommodate a slightly modified semiconductor package 122. The semiconductor package 122 is essentially identical to the package 118 shown in FIG. 1, however, silicon portion 134 is embedded within ceramic portion 132. In particular, the top surface 135 of silicon portion 134 is positioned to be flush with the top surface 133 of ceramic portion 132. As a result, collar 152 may easily communicate with top surface 133 and the heatsink dissipating member may communicate with top surface 135 of silicon even when top surface 135 and top surface 133 are flush with one another. The threading of heat dissipating member 120 is simply threadably adjusted to accommodate a silicon portion 134 which is flush with the ceramic portion 132.

Similarly, as shown in FIG. 9, the present invention may also accommodate a semiconductor package 124 having a silicon portion 134 which is recessed within the ceramic portion 132. In particular, a seat recess 114 is provided to receive and house silicon portion 134. As a result, such a configuration may result in top surface 135 of silicon 134 being lower than top surface 133 of ceramic portion 132. The present invention may easily accommodate such a configuration whereby heat dissipating member 120 is threaded downwardly to the appropriate height to communicate with top surface 135 of silicon 134. As a result of the configuration of the present invention, a wide array of different types of semiconductor devices may be accommodated.

Figure 10:
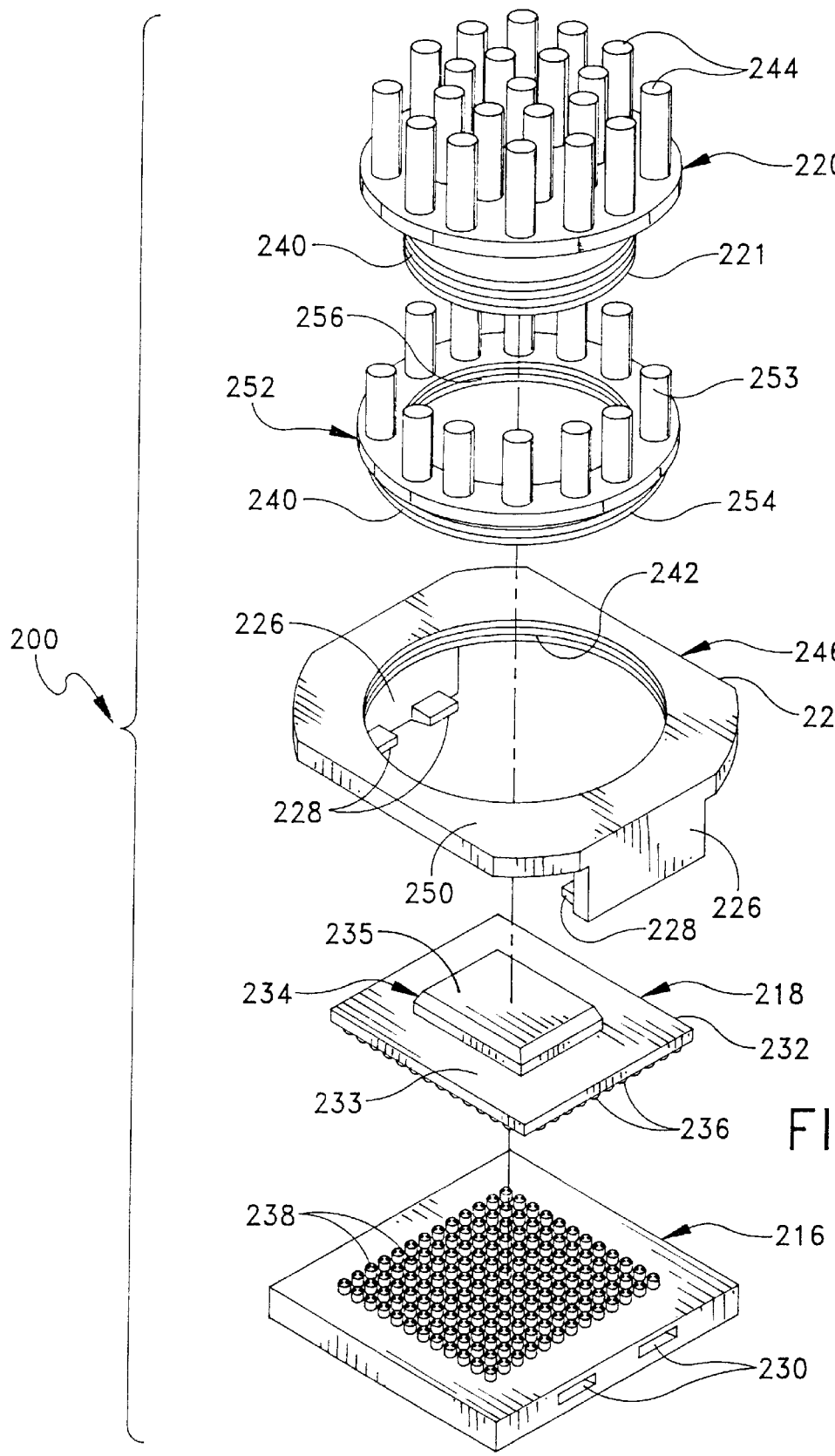
FIG. 10 is an exploded perspective view of an alternative embodiment of the heat sink assembly of the present invention.
Figure 11:
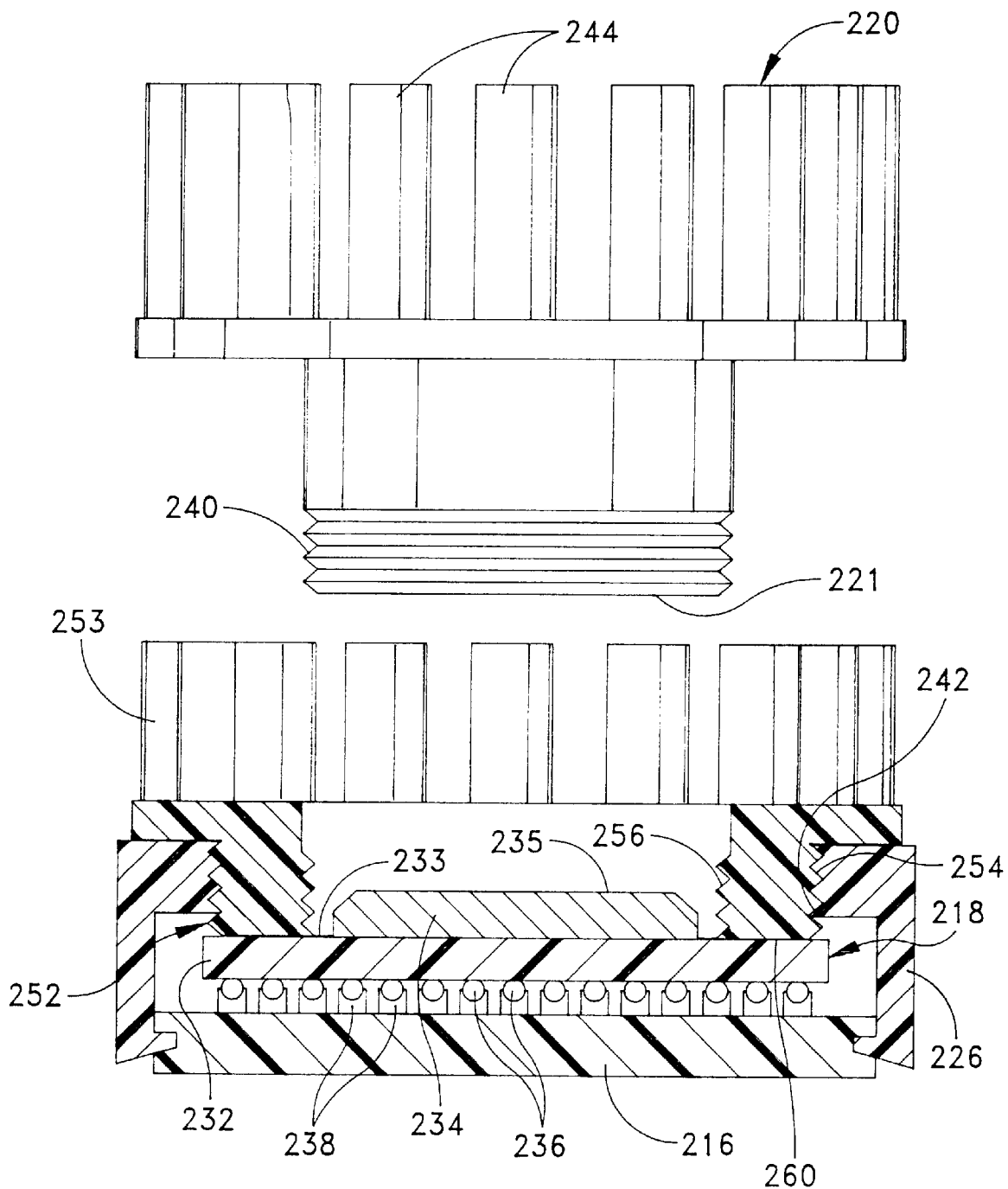
FIG. 11 is a cross-sectional view of FIG. 10 with collar installed.
Figure 12:
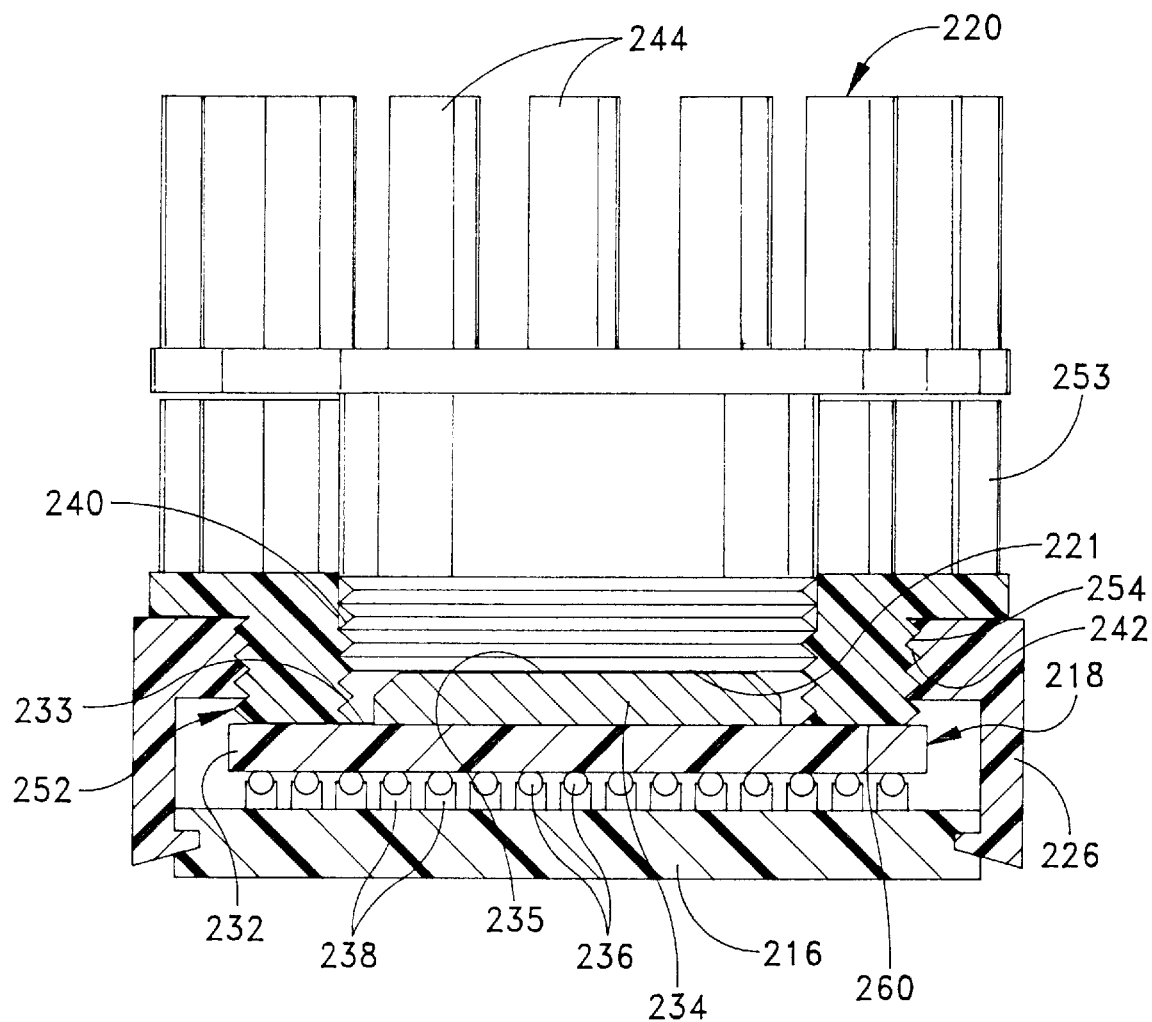
FIG. 12 is a cross-sectional view of FIG. 11 in a fully assembled condition.

Turning now to FIGS. 10–12, an alternative embodiment 200 of the present invention is shown. Referring to FIG. 10, alternative embodiment 200 is, essentially identical to the preferred embodiment of the present invention; however, collar 252 is provided with heat dissipating elements 253 to improve the overall heat dissipation of the assembly. Alternative embodiment 200 includes semiconductor socket 216, commonly installed on or hard-wired to a circuit board (not shown) includes an array of contacts 238 which serve as BGA ball seats for engagement with BGA balls 136 on the underside of BGA semiconductor device package 218. As a result, contact array 238, via socket 216, serves as an interconnection for BGA semiconductor device 218 and the non-soldered engagement of balls 236 thereto to maintain electrical interconnection between BGA device 218 and socket 216.

In particular, BGA device 218 includes a ceramic portion 232 containing internal interconnections (not shown) from silicon portion 234 to BGA contact balls 236. BGA device 218 provides a top surface 233 of ceramic 232 as well as a second top surface 235 of silicon portion 234. BGA device package 218 is installed onto its socket 216 so that solder balls 236 communicate with corresponding seats 238.

Still referring to FIG. 10, the heat sink assembly 200 of the present invention, in similar fashion to the preferred embodiment shown in FIG. 1, includes clip 246 with a central top member 247 having a threaded aperture or bore 242 therethrough. Legs 226 downwardly extend or depend from top member 246. The free ends of legs 126 include inwardly turned flanges 228 for securing clip 246 relative to socket 216. In particular, protrusions or lips 228 engage with aperture 230 in the side walls of socket 216. As a result, clip 246 is secured relative to socket 216 and can adequately provide a framework for the heat sink assembly 200 of the present invention. It should be understood that legs 226 may be modified in similar to the preferred embodiment 100 discussed above.

Referring now to FIGS. 10–12, semiconductor package 218 is positioned on socket 216 and clip 246 is positioned over socket 216 with semiconductor device package 218 disposed therebetween. Flanges 228 of legs 226 reside within apertures 230 and socket 216. Such connection can be made by snapping clip 246 over socket 216 via an outwardly camming action of angled surfaces 229 of legs 226 so that flanges 228 can clear into apertures 130.

Once clip 246 is secured in place relative to socket 216, collar 252, with outer male threads 254 and inner female threaded bore 256 is threadably installed into female threaded aperture 242 of clip 246. Heat dissipating members 253 preferably emanate upwardly from collar 252 so as to further improve the overall heat dissipation capability of assembly 200. Threaded installation of collar 252 into clip 246 may be carried out by manual hand-threading by gripping onto heat dissipating members 253 to facilitate rotation of collar 252.

FIGS. 11 and 12 illustrate different stages of the installation of alternative embodiment 200. The engagement of lower surface 260 of collar 252 to top surface 233 of ceramic portion 232 and engagement of lower surface 221 of heat dissipating member 220 to top surface 235 of silicon portion 234 is, essentially, identical to that carried out in the assembly 100 of the preferred embodiment.

Threaded shank 240 is installed into inner threads 256 of collar 252 so that the bottom surface 221 of heat dissipating member 220 is placed into pressure and flush thermal communication with the top surface 235 of silicon portion 234 of semiconductor package 218. Threaded shank 240 is long enough to pass through collar 252 yet still be able to provide threading to threaded bore 256. Heat dissipating member 220 is threadably engageable with inner threads 256 of collar 252 independently of the engagement of collar 252 with female threaded aperture 242. In the alternative embodiment 200, it is preferred that heat dissipating elements 253 nest underneath heat dissipating elements 244 of heat dissipating member 220 to provide a compact design. As a result, the pressure applied by collar 252 and heat dissipating member 220 can be independently adjusted while both members are engaged with their respective threaded bores. As can be understood and as discussed in connection with the preferred embodiment above, alternative embodiment 200 can also accommodate a wide array of different types of semiconductor packages and different types of socket environments.

It is preferred that the clips 146, 246 and collars 152, 252 be manufactured of plastic material, such as a high temperature resistant and high creep resistant plastic for better withstanding the high temperatures associated with microprocessors. For example, the plastic material for top cover plates 146 and 246 may be LNP VERTON UF-700-10-HS (P.P.A. 50% long fiber) for use in high temperate heat sink applications. Alternatively, clips 146, 246 and collars 152, 252 may be manufactured of metal, such as aluminum, depending on the application. In addition, heat dissipating members 120 and 220 are preferably metal, such as aluminum, for optimum thermal transfer and dissipation of heat from semiconductor device packages 118, 122, 124 and 218. Fins 144, 244 and 253 are provided in a radial configuration but various other heat sink fin configurations, such as a pin grid array, may be employed.

It should be understood that all of the threaded components of the present invention may include various types of threads which are envisioned and are deemed to be within the scope of the present invention. These various thread designs include continuous and interrupted threads. It is preferred that there be at least more than one turn to facilitate the adjustment of pressure. However, a single turn 360° thread, as well as half and quarter turn thread are considered to be within the scope of the present invention due to the ability to impart any desired pressure. Further, bayonet-type attachment methods, which engage with ramped notches within a bore, are also considered to be threads which can provide a gradual, hand-controllable pressure in accordance with the present invention.

The present invention illustrates two levels of pressure, one provided by the collars 152, 252 and the second provided by the threadable engagement of the heat dissipating members 120, 220 into the female-threaded bores 156 and 256, respectively. It is preferred that a lower pressure be applied to the silicon portion than that applied to the ceramic portion. However, it is possible to set both pressures to be equal to one another. Further, in certain applications, it may be desirable, in accordance with the present invention, to apply a greater pressure to the silicon than that applied to the ceramic. In addition, the relative pressures of the collar and the heat sink member can be customized depending upon the location of the silicon on the package. For example, if the silicon is positioned about the periphery of the package, the appropriate pressure of the collar is employed to ensure proper retention and heat dissipation. Third and fourth pressures may also be applied to accommodate the specific needs of a wide array of types of semiconductor device packages. Additional collars 152, 252 may be provided along with additional threaded heat dissipating members 120, 220 to accommodate such device packages.

It would be appreciated by those skilled in the art that various changes and modifications can be made to the illustrated embodiments without departing from the spirit of the present invention. All such modifications and changes are intended to be covered by the appended claims.

What is claimed is:

1. A heat dissipating device for removing heat from an electronic device package, comprising:
    a semiconductor socket;
    a semiconductor package installed in said socket; said semiconductor package having a lower surface with electrical contacts thereon; said electrical contacts being in electrical communication with said semiconductor socket; said semiconductor package including an outer peripheral region of said semiconductor package and a first upper surface and an inner pad region of said semiconductor package and a second upper surface;
    a retaining clip, having a central member and a pair of legs depending downwardly from respective opposing ends of said central member with ends of said pair of legs not connected to said central member being free ends, an aperture disposed through said central member defining a central member bore; female threading formed in said central member bore; means for securing said free ends of said pair of legs relative to said semiconductor socket; said central member bore being positioned substantially above said semiconductor package;
    a collar having an outer edge defining male threading thereon; said collar defining a collar bore therethrough having female threading thereon; said collar being threadably installable into said central member of said retaining clip with said male threading of said collar being threadably engageable with said female threading in said central member bore; said collar being threadably rotatable within said central member bore and positionable into communication with said first upper surface of said semiconductor package at a desired outer peripheral pressure;
    a heat dissipating member having a threaded base portion with a substantially flat bottom surface adapted to be threadably received in said female threaded collar bore so that said flat bottom surface of said heat dissipating member is in flush thermal communication with said second upper surface of said semiconductor package at said inner pad region; said heat dissipating member, and threaded routing into said threaded bore, defining an inner pad region pressure onto said second surface of said semiconductor package;
    whereby said outer peripheral region pressure and said inner pad region pressure are independently selectable.

2. The heat dissipating device of claim 1, wherein said inner pad region pressure applied to said first upper surface of said semiconductor package is the same as said outer peripheral region pressure applied to said second upper surface of said semiconductor package.

3. The heat dissipating device of claim 1, wherein said heat dissipating member includes a plurality of heat dissipating elements.

4. The heat dissipating device of claim 1, wherein said collar includes a plurality of heat dissipating elements.

5. The heat dissipating device of claim 1, wherein said retaining clip is made of plastic.

6. The heat dissipating device of claim 1, wherein said retaining clip is made of metal.

7. The heat dissipating device of claim 1, wherein said collar is made of plastic.

8. The heat dissipating device of claim 1, wherein said collar is made of metal.

9. The heat dissipating device of claim 1, wherein said collar further defines at least one detent in an upper surface of said collar to facilitate rotation of said collar.

10. The heat dissipating device of claim 1, further comprising:
    means for facilitating rotation of said collar connected to said collar.

11. The heat dissipating device of claim 10, wherein said means for facilitating rotation of said collar is a pair of detents in an upper surface of said collar and on opposing sides of said collar bore; said pair of detents being capable of receiving a collar rotation tool.

12. The heat sink assembly of claim 1, wherein said flat bottom surface of said heat sink member is dimensioned to be substantially similar to said second upper surface of said semiconductor package.

13. The heat sink assembly of claim 1, wherein said means for securing said free ends of said pair of legs to said semiconductor socket are inwardly directed lips, respectively emanating from said free ends of said pair of legs into communication with respective opposing sides of said semiconductor socket.

14. A heat dissipating device for removing heat from an electronic device package, comprising:

a semiconductor socket;

a semiconductor package installed in said socket; said semiconductor package having a lower surface with electrical contacts thereon; said electrical contacts being in electrical communication with said semiconductor socket; said semiconductor package including a first upper surface and a second upper surface;

a retaining clip, having a central member; said retaining clip having a female threaded clip bore therethrough;

means for securing said retaining clip relative to said semiconductor socket;

a collar having an outer edge with male threading thereon and a central female threaded collar bore therethrough; said collar being threadably installable in said clip bore into communication with said first upper surface at a first pressure;

a heat dissipating member having a threaded base portion; said heat dissipating member being threadably installable in said collar bore into communication with said second upper surface at a second pressure;

whereby said first pressure and said second pressure are independently selectable by threadable rotation of said collar and said heat dissipating member, respectively.

* * * * *